(12) United States Patent
Matsumoto (10) Patent No.: US 8,686,564 B2
(45) Date of Patent: Apr. 1, 2014

(54) SEMICONDUCTOR DEVICE

(75) Inventor: Takeshi Matsumoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 117 days.

(21) Appl. No.: 13/404,189

(22) Filed: Feb. 24, 2012

(65) Prior Publication Data

US 2012/0153491 A1 Jun. 21, 2012

Related U.S. Application Data (63) Continuation of application No. PCT/JP2010/006131, filed on Oct. 15, 2010.

(30) Foreign Application Priority Data

Dec. 4, 2009 (JP) .................................. 2009-276510

(51) Int. Cl.
*H01L 23/48* (2006.01)

(52) U.S. Cl.
USPC ....... 257/773; 257/780; 257/781; 257/E23.01

(58) Field of Classification Search
USPC .............. 257/773, E23.01, 780, 784, E23.02, 257/E23.021
See application file for complete search history.

(56) References Cited

U.S. PATENT DOCUMENTS

| 6,593,799 | B2 * | 7/2003 | De et al. | 327/534 |
| 7,615,453 | B2 * | 11/2009 | Minami | 438/276 |
| 7,939,397 | B2 * | 5/2011 | Onoda et al. | 438/197 |
| 8,330,188 | B2 * | 12/2012 | Yoshida et al. | 257/202 |
| 2008/0061324 | A1 | 3/2008 | Yoshida et al. | |

FOREIGN PATENT DOCUMENTS

| JP | 2002-296517 | 10/2002 |
| JP | 2006-024853 | 1/2006 |
| JP | 2007-335572 | 12/2007 |
| JP | 2008-071774 | 3/2008 |

OTHER PUBLICATIONS

International Search Report of PCT Application No. PCT/JP2010/006131, dated Jan. 11, 2011.

* cited by examiner

*Primary Examiner* — Jasmine Clark
(74) *Attorney, Agent, or Firm* — Panasonic Patent Center (57) ABSTRACT

A first transistor group, a second transistor group, and an electrode pad are formed on a semiconductor substrate. A first protective film is formed so as to cover the semiconductor substrate except for an upper region of the electrode pad. The second protective film which generates a stress in a projecting direction is formed so as to cover the first protective film except for an upper region of the first transistor group. A transistor ability of the first transistor group is varied to be relatively higher due to a presence of the second protective film, based on a transistor ability of the second transistor group, as a reference.

21 Claims, 7 Drawing Sheets

SEMICONDUCTOR DEVICE

BACKGROUND

1. Technical Field

The present invention relates to a structure of a semiconductor device, and more particularly to a structure of a semiconductor device provided with a semiconductor circuit or the like which includes a MIS (Metal Insulator Semiconductor) transistor.

2. Background Art

Figure 9A:
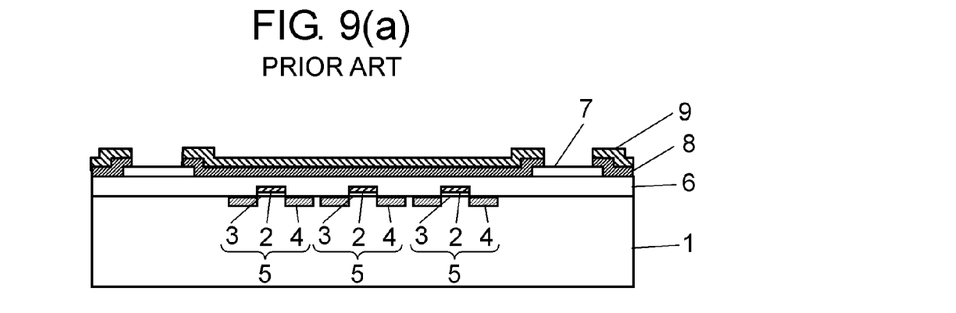
FIG. 9(a) is a view showing one example of a cross-sectional structure of a conventional semiconductor device.
Figure 9B:
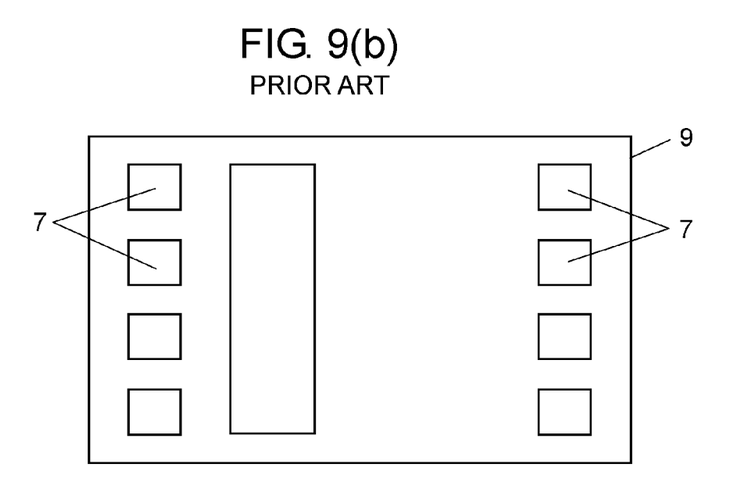
FIG. 9(b) is a view showing one example of a top structure of the conventional semiconductor device.

FIG. 9(a) is a view showing one example of a cross-sectional structure of a conventional semiconductor device, and FIG. 9(b) is a view showing one example of a top structure of the conventional semiconductor device.

As shown in FIGS. 9(a) and (b), transistors 5 composing the semiconductor device are formed on wafer-shaped semiconductor substrate 1 formed of Si or GaAs in general. Each of transistors 5 has gate electrode 2 formed above semiconductor substrate 1 with gate insulator film 3 interposed therebetween, and source and drain regions 4 formed on both sides of gate electrode 2, in semiconductor substrate 1. Interlayer insulator film 6 is formed on semiconductor substrate 1 so as to cover an upper part of transistor 5, and electrode pad 7 is provided on interlayer insulator film 6 so as to electrically connecting the semiconductor device including transistor 5 to an external device. In general, electrode pad 7 is formed of Al. In addition, interlayer insulator film 6 is generally covered except for a formation region of electrode pad 7 with a surface protective film having a two-layer structure, that is, first surface protective film 8 formed of SiN or the like, and second surface protective film 9 formed of polyimide or the like.

SUMMARY

A first semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a projecting direction. A transistor ability of the first transistor group is varied to be relatively higher due to a presence of the second protective film, based on a transistor ability of the second transistor group, as a reference.

In addition, a second semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a projecting direction. A transistor ability of the first transistor group is varied to be relatively lower due to a presence of the second protective film, based on a transistor ability of the second transistor group, as a reference.

A third semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a caving-in direction. A transistor ability of the first transistor group is varied to be relatively higher due to a presence of the second protective film, based on a transistor ability of the second transistor group, as a reference.

A fourth semiconductor device according to the present invention includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a caving-in direction. A transistor ability of the first transistor group is varied to be relatively lower due to a presence of the second protective film, based on a transistor ability of the second transistor group, as a reference.

A fifth semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a projecting direction. A transistor ability of the second transistor group is varied to be higher due to a presence of the second protective film than a case where the second protective film is not formed.

In addition, a sixth semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a projecting direction. A transistor ability of the second transistor group is varied to be lower due to a presence of the second protective film than a case where the second protective film is not formed.

A seventh semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a caving-in direction. A transistor ability of the second transistor group is varied to be higher due to a presence of the second protective film than a case where the second protective film is not formed.

In addition, an eighth semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a caving-in direction. A transistor ability of the second transistor group is varied to be lower due to a presence of the second protective film than a case where the second protective film is not formed.

DESCRIPTION OF EMBODIMENTS

The conventional semiconductor device shown in FIGS. 9(a) and (b) has the following problems. In general, transistor 5 composing the semiconductor device is varied in transistor ability while it is produced. That is, a variation in transistor abilities of transistors 5 is generated even in one semiconductor device. As a result, there is a problem that desired performance cannot be achieved in the conventional semiconductor device.

In view of the above, it is an object of the present invention to provide a semiconductor device which can achieve desired performance even when a variation in transistor abilities is varied while transistors composing the semiconductor device are produced.

First Exemplary Embodiment

Hereinafter, a description will be made of a semiconductor device according to a first exemplary embodiment, more specifically, a structure of a semiconductor device provided with a semiconductor circuit including a MIS transistor and the like, and a method for producing the same, with reference to the drawings.

Figure 1A:
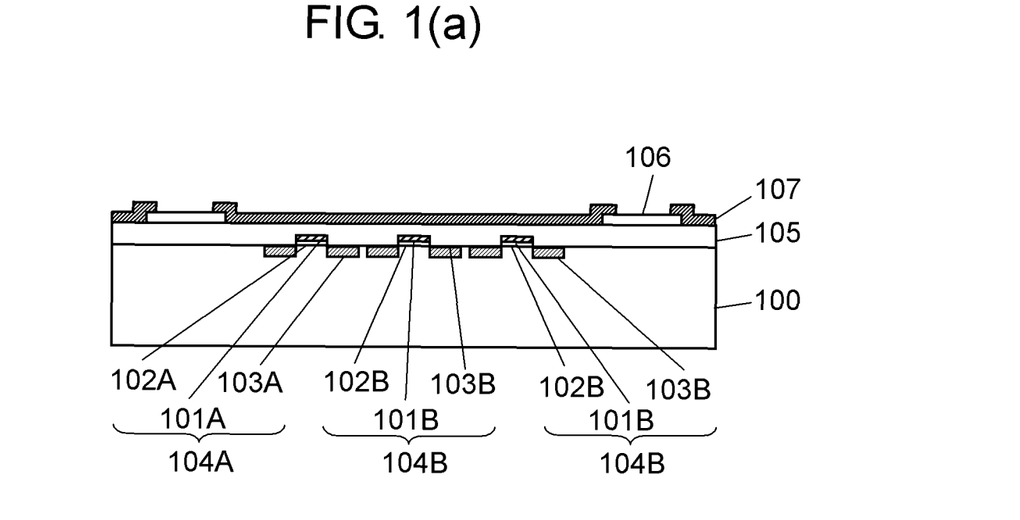
FIGS. 1(a) to (c) are cross-sectional views showing steps in a method for producing a semiconductor device according to a first exemplary embodiment.
Figure 1B:
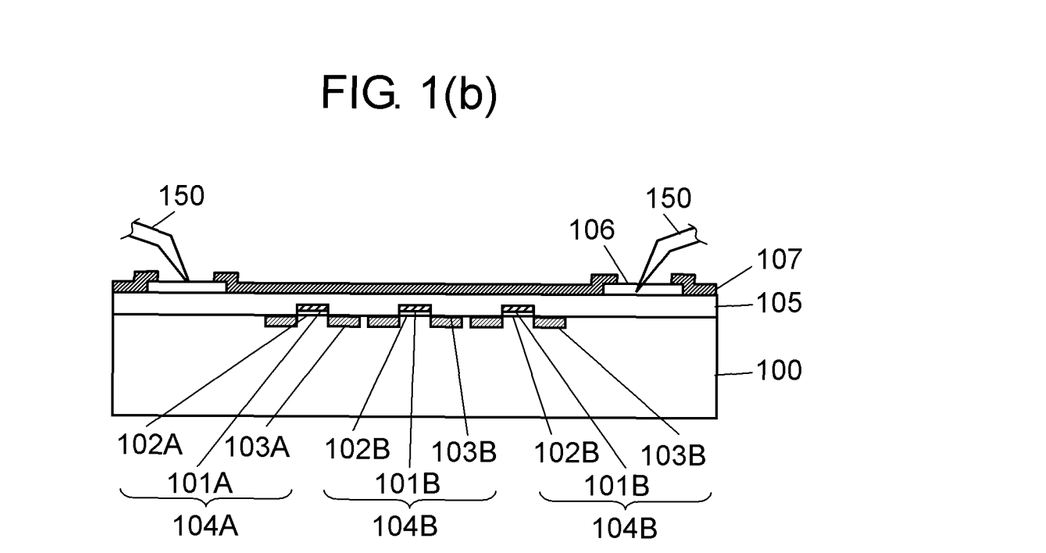
Figure 1C:
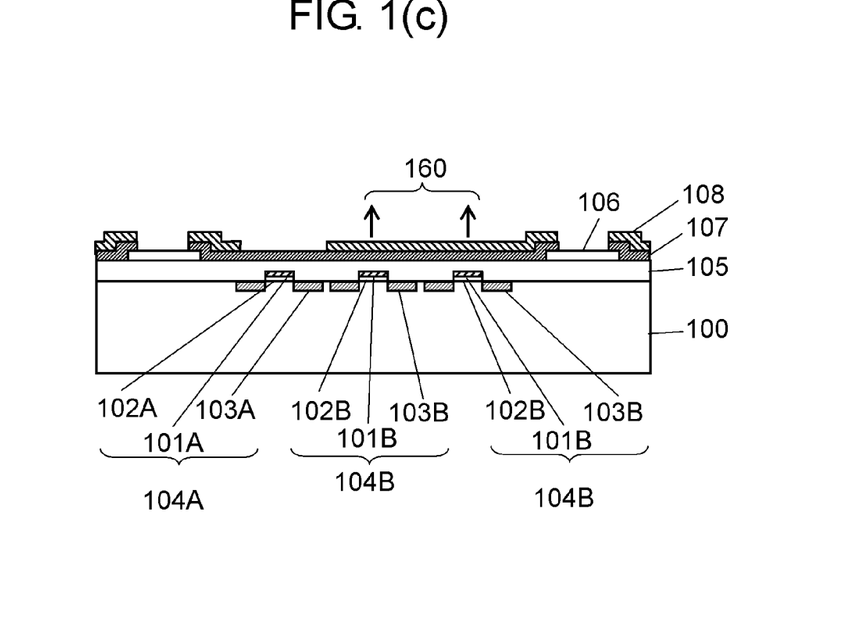
Figure 1D:
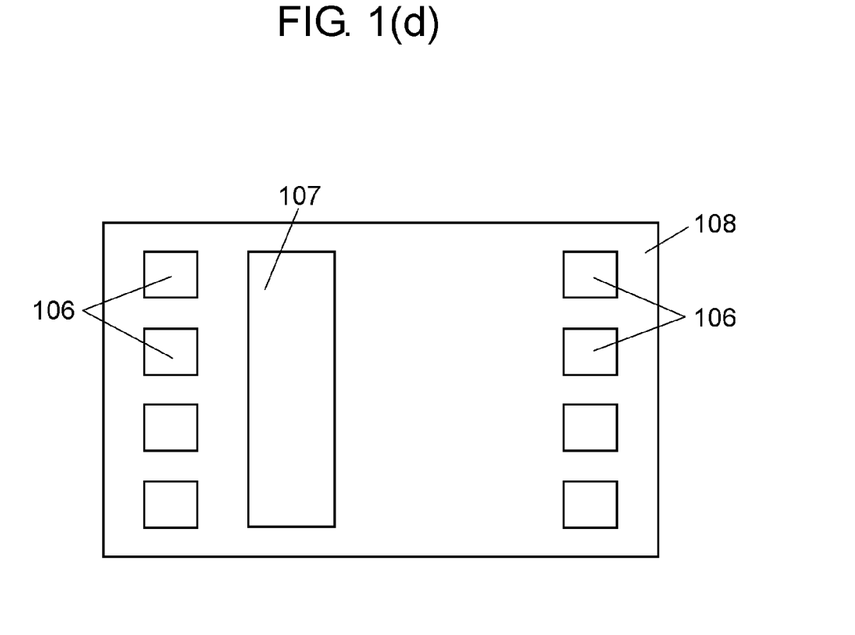
FIG. 1(d) is a plan view corresponding to FIG. 1(c).

FIGS. 1(a) to (c) are cross-sectional views showing steps of the method for producing the semiconductor device according to the first exemplary embodiment, and FIG. 1(d) is a plan view corresponding to FIG. 1(c).

First, as shown in FIG. 1(a), transistors 104A and 104B composing the semiconductor device are formed on semiconductor substrate 100 formed of a material such as Si or GaAs. Transistor 104A has gate electrode 101A formed above semiconductor substrate 100 with gate insulator film 102A interposed therebetween, and source and drain regions 103A formed on both sides of gate electrode 101A, in semiconductor substrate 100. Transistor 104B has gate electrode 101B formed above semiconductor substrate 100 with gate insulator film 102B interposed therebetween, and source and drain regions 103B formed on both sides of gate electrode 101B, in semiconductor substrate 100.

Then, interlayer insulator film 105 is formed on semiconductor substrate 100 so as to cover upper parts of transistors 104A and 104B, and then electrode pad 106 is formed on interlayer insulator film 105 to electrically connect the semiconductor device including transistors 104A and 104B, to an external device. Electrode pad 106 is made of a conductive material such as Al. In addition, although not shown, a wire, a via, a contact, and the like are formed in interlayer insulator film 105 to electrically connect transistors 104A and 104B to electrode pad 106. In addition, in FIGS. 1(a) to (c), each transistor is illustrated so as to be larger than an actual dimension for easy understanding. That is, the actual numbers of transistors 104A and 104B are larger than the illustrated numbers, respectively, and there are a transistor group (first transistor group) including transistors 104A, and a transistor group (second transistor group) including transistors 104B.

Then, first surface protective film 107 made of a SiN film, for example, having a thickness of 1 μm is formed so as to cover semiconductor substrate 100 except for an upper region of electrode pad 106. First surface protective film 107 may cover an end of electrode pad 106.

Then, as shown in FIG. 1(b), electric characteristics of the semiconductor device are measured. More specifically, while needle tips of probe card 150 is in contact with electrode pad 106, a current is applied thereto, to measure electric characteristics of each transistor.

Then, as a result of the electric characteristics measurement shown in FIG. 1(b), when it is determined that there is a transistor group having a transistor ability (such as an Idsat ability, a Vt ability, or carrier mobility: the same is true in the following) to be varied, based on the other transistor group as a reference (it is assumed that an ability of each transistor 104A in "the first transistor group" is desired to be varied in this exemplary embodiment), as shown in FIGS. 1(c) and 1(d), second surface protective film 108 which generates projecting direction stress (stress acting upward in a perpendicular direction with respect to a substrate main surface: the same is true in the following) 160 is formed so as to cover first surface protective film 107 except for an upper region of "the first transistor group including transistors 104A". As second surface protective film 108, a polyimide film or PBO film may be used.

Thus, an ability of each transistor 104B composing "the second transistor group" positioned under second surface protective film 108 is varied by projecting direction stress 160 generated by second surface protective film 108. As a result, an ability of each transistor 104A composing "the first transistor group" which is not positioned under second surface protective film 108 is relatively varied, based on the ability of each transistor 104B composing "the second transistor group", as a reference. That is, since the ability of the transistor composing the semiconductor device can be selectively controlled, the semiconductor device which can achieve desired performance can be provided even when a variation of the transistor ability is generated while the transistor composing the semiconductor device is produced.

More specifically, like this exemplary embodiment, when it is assumed that a crystal orientation of the main surface of semiconductor substrate 100 is (100) and each transistor 104B is a Nch-type transistor in the case where second surface protective film 108 which generates projecting direction stress 160 is used, the ability of transistor 104B becomes higher, and as a result, the ability of transistor 104A becomes relatively lower. Even when the ability of each transistor 104A composing "the first transistor group" is high, based on the other transistor group after the measurement of the electric characteristics shown in FIG. 1(b), the ability of each transistor 104A is relatively lowered due to a presence of second surface protective film 108 and the variation in abilities can be reduced, so that the semiconductor device which can achieve desired performance can be provided.

In addition, like this exemplary embodiment, when it is assumed that the crystal orientation of the main surface of semiconductor substrate 100 is (100) and each transistor 104B is a Pch-type transistor in the case where second surface protective film 108 which generates projecting direction stress 160 is used, the ability of transistor 104B becomes lower, and as a result, the ability of transistor 104A becomes relatively higher. Even when the ability of each transistor 104A composing "the first transistor group" is low, based on the other transistor group after the measurement of the electric characteristics shown in FIG. 1(b), the ability of each transistor 104A is relatively enhanced due to a presence of second surface protective film 108 and the variation in abilities can be reduced, so that the semiconductor device which can achieve desired performance can be provided.

As described above, in this exemplary embodiment, it is necessary to use second surface protective film 108 with attention to the crystal orientation of the main surface of semiconductor substrate 100, and the conductivity type (Nch or Pch) of transistor 104B.

In addition, in this exemplary embodiment, by changing a thickness of second surface protective film 108, projecting direction stress 160 can be changed. Thus, an ability variation value of the transistor group whose ability is desired to be varied can be controlled.

Furthermore, in this exemplary embodiment, semiconductor substrate 100 may be a semiconductor wafer. In addition, while the SiN film is used as first surface protective film 107 in the above, another insulator film such as a polyimide film or PBO film may be used instead. In addition, an insulator film such as a polyimide film or PBO film may be used as second surface protective film 108.

Furthermore, in this exemplary embodiment, second surface protective film 108 is formed so as to cover first surface protective film 107 except for the upper region of "the first transistor group including transistors 104A". In other words, "the first transistor group including transistors 104A" is arranged in a lower region of an opening of second surface protective film 108. Here, few transistors 104B or another transistor may be arranged in the lower region of the opening of second surface protective film 108. In addition, few transistors 104A may be arranged in an outside region of the opening of second surface protective film 108.

(Modification of First Exemplary Embodiment)

Hereinafter, a description will be made of a semiconductor device according to a modification of the first exemplary embodiment, more specifically, a structure of a semiconductor device provided with a semiconductor circuit including a MIS transistor and the like and a method for producing the same, with reference to the drawings.

Figure 2:
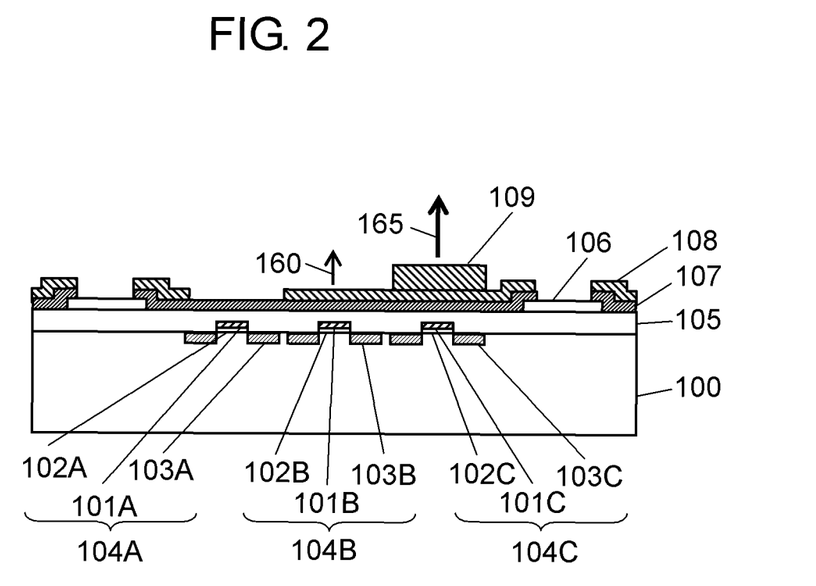
FIG. 2 is a cross-sectional view showing a structure of a semiconductor device according to a modification of the first exemplary embodiment.

FIG. 2 is a cross-sectional view showing the structure of the semiconductor device according to the modification of the first exemplary embodiment. In FIG. 2, the same components as those of the semiconductor device of the first exemplary embodiment shown in FIGS. 1(a) to (d) are designated by the same reference marks, and a duplicate description is omitted. In addition, in FIG. 2, similar to FIGS. 1(a) to (c), each of transistors 104A, 104B, and 104C is illustrated so as to be larger than an actual dimension for easy understanding. That is, the actual numbers of transistors 104A, 104B, and 104C are larger than the illustrated numbers, respectively, and there are a transistor group (first transistor group) including transistors 104A, a transistor group (second transistor group) including transistors 104B, and a transistor group (third transistor group) including transistors 104C.

This modification differs from the first exemplary embodiment in that, as shown in FIG. 2, "the third transistor group including transistors 104C" covered with first surface protective film 107 and second surface protective film 108 is formed on semiconductor substrate 100, and third surface protective film 109 which generates projecting direction stress 165 is formed so as to cover second surface protective film 108 provided in an upper region of "the third transistor group including transistors 104C". Each transistor 104C has gate electrode 101C formed above semiconductor substrate 100 with gate insulator film 102C interposed therebetween, and source and drain regions 103C formed on both sides of gate electrode 101C, in semiconductor substrate 100. In addition, it is assumed that transistor 104C is determined as the transistor whose ability is desired to be varied as the result of the electric characteristics measurement shown in FIG. 1(b) of the first exemplary embodiment. Meanwhile, projecting direction stress 165 is provided by adding a projecting direction stress by third surface protective film 109 to projecting direction stress 160 by second surface protective film 108. Furthermore, similar to the first exemplary embodiment, second surface protective film 108 which generates projecting direction stress 160 is formed so as to cover first surface protective film 107 except for an upper region of "the first transistor group including transistors 104A" in this modification also.

According to this modification, in addition to the same effect as the first exemplary embodiment, the following effect can be provided. That is, an ability of each transistor 104C composing "the third transistor group" positioned under a laminated structure of second surface protective film 108 and third surface protective film 109 which generate projecting direction stress 165 is largely varied by projecting direction stress 165. In other words, the ability of each transistor 104C composing "the third transistor group" is largely varied compared to a case where third surface protective film 109 is not formed. Therefore, the ability of the transistor composing the semiconductor device can be further selectively controlled.

More specifically, like this modification, when it is assumed that a crystal orientation of a main surface of semiconductor substrate 100 is (100) and each transistor 104C is a Nch-type transistor in the case where third surface protective film 109 which generates projecting direction stress 165 is used, the ability of each transistor 104C composing "the third transistor group" becomes higher compared to the case where third surface protective film 109 is not formed. Even when the ability of each transistor 104C composing "the third transistor group" is low, based on the other transistor group as a reference after the measurement of the electric characteristics shown in FIG. 1(b), the ability of each transistor 104C composing "the third transistor group" is enhanced due to a presence of third surface protective film 109 and the variation in abilities can be reduced, so that the semiconductor device which can achieve desired performance can be provided.

In addition, like this modification, when it is assumed that the crystal orientation of the main surface of semiconductor substrate 100 is (100) and each transistor 104C is a Pch-type transistor in the case where third surface protective film 109 which generates projecting direction stress 165 is used, the ability of each transistor 104C composing "the third transistor group" becomes lower compared to the case where third surface protective film 109 is not formed. Even when the ability of each transistor 104C composing "the third transistor group" is high, based on the other transistor group as a reference after the measurement of the electric characteristics shown in FIG. 1(b), the ability of each transistor 104C composing "the third transistor group" is lowered by third surface protective film 109 and the variation in abilities can be reduced, so that the semiconductor device which can achieve desired performance can be provided.

In addition, in this modification, projecting direction stress 165 can be changed by changing at least one of a thickness of second surface protective film 108 and a thickness of third surface protective film 109. Thus, an ability variable value of the transistor group whose ability is desired to be varied can be controlled.

In addition, in this modification, an insulator film such as a polyimide film or PBO film may be used as third surface protective film 109.

Furthermore, according to this modification, second surface protective film 108 is formed so as to cover first surface protective film 107 except for the upper region of "the first transistor group including transistors 104A". In other words, "the first transistor group including transistors 104A" is arranged in a lower region of an opening of second surface protective film 108. Here, few transistors 104B and 104C or another transistor may be arranged in the lower region of the opening of second surface protective film 108. In addition, few transistors 104A may be arranged in an outside region of the opening of second surface protective film 108.

In addition, in this modification, third surface protective film 109 is formed so as to cover second surface protective film 108 in the upper region of "the third transistor group including transistors 104C". In other words, "the third transistor group including transistors 104C" is arranged in a lower region of third surface protective film 109. Here, few transistors 104A and 104B or another transistor may be arranged in the lower region of third surface protective film 109. In addition, few transistors 104C may be arranged in an outside region of third surface protective film 109.

Second Exemplary Embodiment

Hereinafter, a description will be made of a semiconductor device according to a second exemplary embodiment, more specifically, a structure of a semiconductor device provided with a semiconductor circuit including a MIS transistor and the like, and a method for producing the same, with reference to the drawings.

Figure 3A:
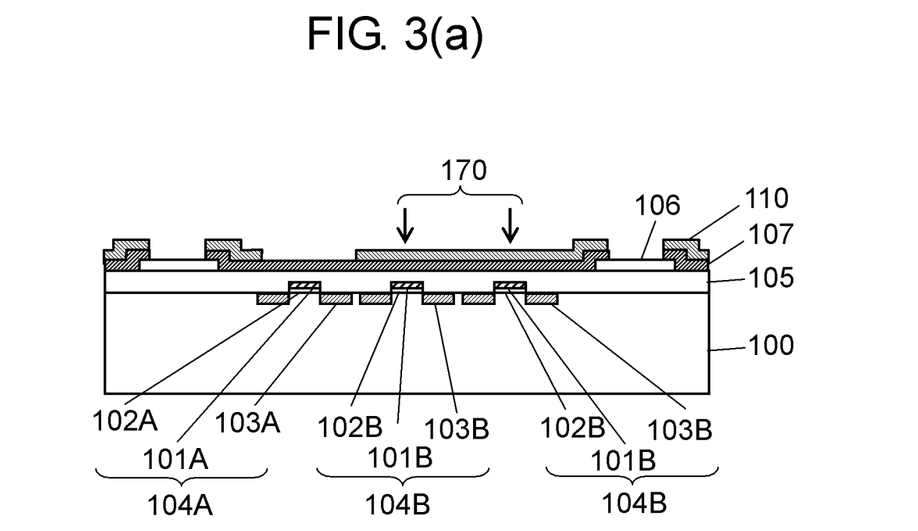
FIG. 3(a) is a cross-sectional view showing a structure of a semiconductor device according to a second exemplary embodiment.
Figure 3B:
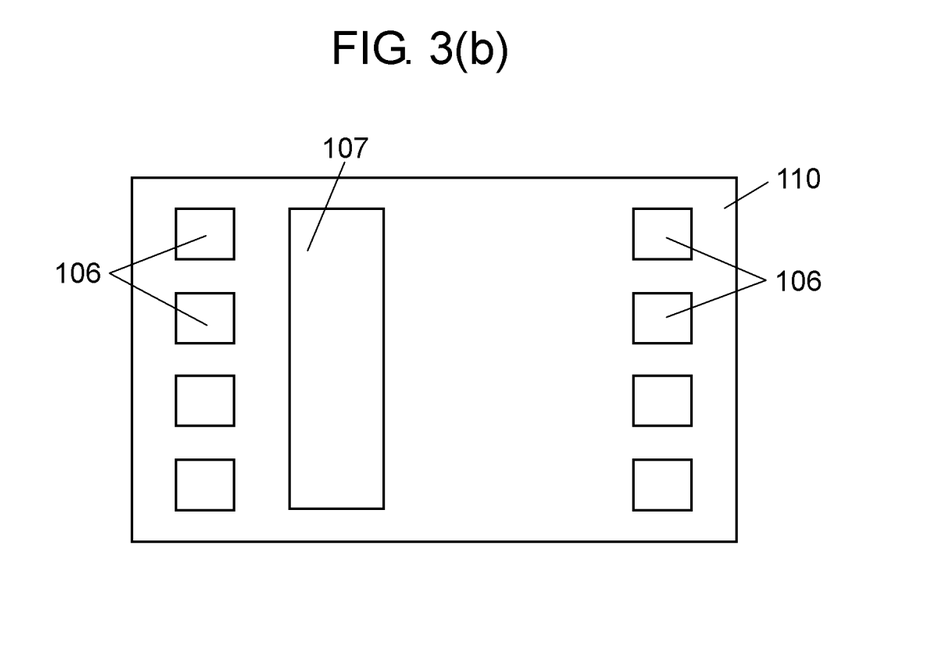
FIG. 3(b) is a plan view corresponding to FIG. 3(a).

FIG. 3(a) is a cross-sectional view showing the structure of the semiconductor device according to the second exemplary embodiment, and FIG. 3(b) is a plan view corresponding to FIG. 3(a). In FIGS. 3(a) and (b), the same components as those of the semiconductor device of the first exemplary embodiment shown in FIGS. 1(a) to (d) are designated by the same reference marks, and a duplicate description is omitted. In addition, in FIG. 3(a), similar to FIGS. 1(a) to (c), each transistor is illustrated so as to be larger than an actual dimension for easy understanding. That is, the actual numbers of transistors 104A and 104B are larger than the illustrated numbers, respectively, and there are a transistor group (first transistor group) including transistors 104A, and a transistor group (second transistor group) including transistors 104B.

This exemplary embodiment differs from the first exemplary embodiment in that, as shown in FIGS. 3(a) and (b), after the steps shown in FIGS. 1(a) and 1(b) of the first exemplary embodiment are sequentially performed, second surface protective film 110 which generates caving-in direction stress (stress acting downward in a perpendicular direction with respect to a substrate main surface: the same is true in the following) 170 is formed so as to cover first surface protective film 107 except for an upper region of "the first transistor group including transistors 104A". As second surface protective film 110, a polyimide film or PBO film may be used. In this exemplary embodiment also, it is assumed that transistor 104A is determined as the transistor whose transistor ability is desired to be varied, based on the other transistor as a reference, as the result of the electric characteristics measurement shown in FIG. 1(b).

Thus, an ability of each transistor 104B composing "the second transistor group" positioned under second surface protective film 110 is varied by caving-in direction stress 170 generated by second surface protective film 110. As a result, an ability of each transistor 104A composing "the first transistor group" which is not positioned under second surface protective film 110 is relatively varied, based on the ability of each transistor 104B composing "the second transistor group" as a reference. That is, since the ability of the transistor composing the semiconductor device can be selectively controlled, the semiconductor device which can achieve desired performance can be provided even when a variation in the transistor abilities is generated while the transistors composing the semiconductor device are produced.

More specifically, like this exemplary embodiment, when it is assumed that a crystal orientation of a main surface of semiconductor substrate 100 is (100) and each transistor 104B is a Nch-type transistor in the case where second surface protective film 110 which generates caving-in direction stress 170 is used, the ability of each transistor 104B composing "the second transistor group" becomes lower, and as a result, the ability of each transistor 104A composing "the first transistor group" becomes relatively higher. Even when the ability of each transistor 104A composing "the first transistor group" is low, based on the other transistor group as a reference after the measurement of the electric characteristics shown in FIG. 1(b), the ability of each transistor 104A composing "the first transistor group" is relatively enhanced due to a presence of second surface protective film 110 and the variation in abilities can be reduced, so that the semiconductor device which can achieve desired performance can be provided.

In addition, like this exemplary embodiment, when it is assumed that the crystal orientation of the main surface of semiconductor substrate 100 is (100) and each transistor 104B is a Pch-type transistor in the case where second surface protective film 110 which generates caving-in direction stress 170 is used, the ability of each transistor 104B composing "the second transistor group" becomes higher, and as a result, the ability of each transistor 104A composing "the first transistor group" becomes relatively lower. Even when the ability of each transistor 104A composing "the first transistor group" is high, based on the other transistor group as a reference after the measurement of the electric characteristics shown in FIG. 1(b), the ability of each transistor 104A composing "the first transistor group" is relatively lowered due to a presence of second surface protective film 110 and the variation in abilities can be reduced, so that the semiconductor device which can achieve desired performance can be provided.

As described above, in this exemplary embodiment, it is necessary to use second surface protective film 110 with attention to the crystal orientation of the main surface of semiconductor substrate 100, and the conductivity type (Nch or Pch) of transistor 104B.

In addition, in this exemplary embodiment, caving-in direction stress 170 can be changed by changing a thickness of second surface protective film 110. Thus, an ability variable value of the transistor group whose ability is desired to be varied can be controlled.

Meanwhile, in this exemplary embodiment, an insulator film such as a polyimide film or PBO film may be used as second surface protective film 110.

Furthermore, in this exemplary embodiment, second surface protective film 110 is formed so as to cover first surface protective film 107 except for the upper region of "the first transistor group including transistors 104A". In other words, "the first transistor group including transistors 104A" is arranged in a lower region of an opening of second surface protective film 110. Here, few transistors 104B or another transistor may be arranged in the lower region of the opening of second surface protective film 110. In addition, few transistors 104A may be arranged in an outside region of the opening of second surface protective film 110.

(Modification of Second Exemplary Embodiment)

Hereinafter, a description will be made of a semiconductor device according to a modification of the second exemplary embodiment, more specifically, a structure of a semiconductor device provided with a semiconductor circuit including a MIS transistor and the like and a method for producing the same, with reference to the drawings.

Figure 4:
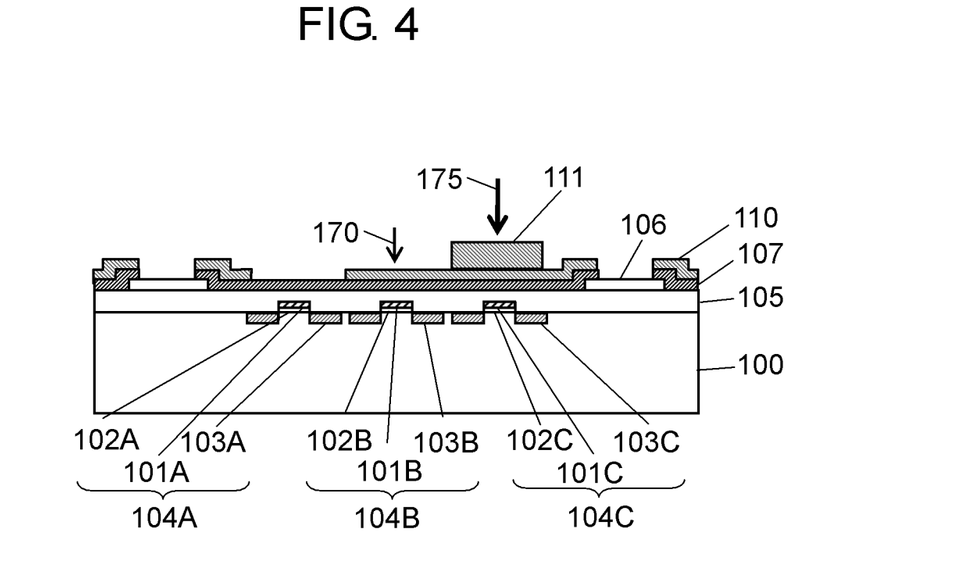
FIG. 4 is a cross-sectional view showing a structure of a semiconductor device according to a modification of the second exemplary embodiment.

FIG. 4 is a cross-sectional view showing the structure of the semiconductor device according to the modification of the second exemplary embodiment. In FIG. 4, the same components as those of the semiconductor device of the first exemplary embodiment shown in FIGS. 1(a) to (d) or the semiconductor device according to the second exemplary embodiment shown in FIGS. 3(a) and (b) are designated by the same reference marks, and a duplicate description is omitted. In addition, in FIG. 4, similar to FIGS. 1(a) to (c) and FIG. 3(a), each transistor is illustrated so as to be larger than an actual dimension for easy understanding. That is, the actual numbers of transistors 104A, 104B, and 104C are larger than the illustrated numbers, respectively, and there are a transistor group (first transistor group) including transistors 104A, a transistor group (second transistor group) including transistors 104B, and a transistor group (third transistor group) including transistors 104C.

This modification differs from the second exemplary embodiment in that, as shown in FIG. 4, "the third transistor group including transistors 104C" covered with first surface protective film 107 and second surface protective film 110 is formed on semiconductor substrate 100, and third surface protective film 111 which generates caving-in direction stress 175 is formed so as to cover second surface protective film 110 provided in an upper region of "the third transistor group including transistors 104C". Each transistor 104C has gate electrode 101C formed above semiconductor substrate 100 with gate insulator film 102C interposed therebetween, and source and drain regions 103C formed on both sides of gate electrode 101C, in semiconductor substrate 100. In addition, it is assumed that transistor 104C is determined as the transistor whose ability is desired to be varied as the result of the electric characteristics measurement shown in FIG. 1(b) of the first exemplary embodiment. Meanwhile, caving-in direction stress 175 is provided by adding a caving-in direction stress by third surface protective film 111 to caving-in direction stress 170 by second surface protective film 110. Furthermore, similar to the second exemplary embodiment, second surface protective film 110 which generates caving-in direction stress 170 is formed so as to cover first surface protective film 107 except for an upper region of "the first transistor group including transistors 104A" in this modification also.

According to this modification, in addition to the same effect as the second exemplary embodiment, the following effect can be provided. That is, an ability of each transistor 104C composing "the third transistor group" positioned under a laminated structure of second surface protective film 110 and third surface protective film 111 which generate caving-in direction stress 175 is largely varied by caving-in direction stress 175. In other words, the ability of each transistor 104C composing "the third transistor group" is largely varied, compared to a case where third surface protective film 111 is not formed. Therefore, the ability of the transistor composing the semiconductor device can be further selectively controlled.

More specifically, like this modification, when it is assumed that a crystal orientation of a main surface of semiconductor substrate 100 is (100) and each transistor 104C is a Nch-type transistor in the case where third surface protective film 111 which generates caving-in direction stress 175 is used, the ability of each transistor 104C composing "the third transistor group" becomes lower, compared to the case where third surface protective film 111 is not formed. Even when the ability of each transistor 104C composing "the third transistor group" is high, based on the other transistor group as a reference after the measurement of the electric characteristics shown in FIG. 1(b), the ability of each transistor 104C composing "the third transistor group" is lowered due to a presence of third surface protective film 111 and the variation in abilities can be reduced, so that the semiconductor device which can achieve desired performance can be provided.

In addition, like this modification, when it is assumed that the crystal orientation of the main surface of semiconductor substrate 100 is (100) and each transistor 104C is a Pch-type transistor in the case where third surface protective film 111 which generates caving-in direction stress 175 is used, the ability of each transistor 104C composing "the third transistor group" becomes higher, compared to the case where third surface protective film 111 is not formed. Even when the ability of each transistor 104C composing "the third transistor group" is low, based on the other transistor group as a reference after the measurement of the electric characteristics shown in FIG. 1(b), the ability of each transistor 104C composing "the third transistor group" is enhanced due to a presence of third surface protective film 111 and the variation in abilities can be reduced, so that the semiconductor device which can achieve desired performance can be provided.

Meanwhile, in this modification, caving-in direction stress 175 can be changed by changing at least one of a thickness of second surface protective film 110 and a thickness of third surface protective film 111. Thus, an ability variable value of the transistor group whose ability is desired to be varied can be controlled.

In addition, in this modification, an insulator film such as a polyimide film or PBO film may be used as third surface protective film 111.

Furthermore, in this modification, second surface protective film 110 is formed so as to cover first surface protective film 107 except for the upper region of "the first transistor group including transistors 104A". In other words, "the first transistor group including transistors 104A" is arranged in a lower region of an opening of second surface protective film 110. Here, few transistors 104B and 104C or another transistor may be arranged in the lower region of the opening of second surface protective film 110. In addition, few transistors 104A may be arranged in an outside region of the opening of second surface protective film 110.

In addition, in this modification, third surface protective film 111 is formed so as to cover second surface protective film 110 in the upper region of "the third transistor group including transistors 104C". In other words, "the third transistor group including transistors 104C" is arranged in a lower region of third surface protective film 111. Here, few transistors 104A and 104B or another transistor may be arranged in the lower region of third surface protective film 111. In addition, few transistors 104C may be arranged in an outside region of third surface protective film 110.

Third Exemplary Embodiment

Hereinafter, a description will be made of a semiconductor device according to a third exemplary embodiment, more specifically, a structure of a semiconductor device provided with a semiconductor circuit including a MIS transistor and the like and a method for producing the same, with reference to the drawings.

Figure 5:
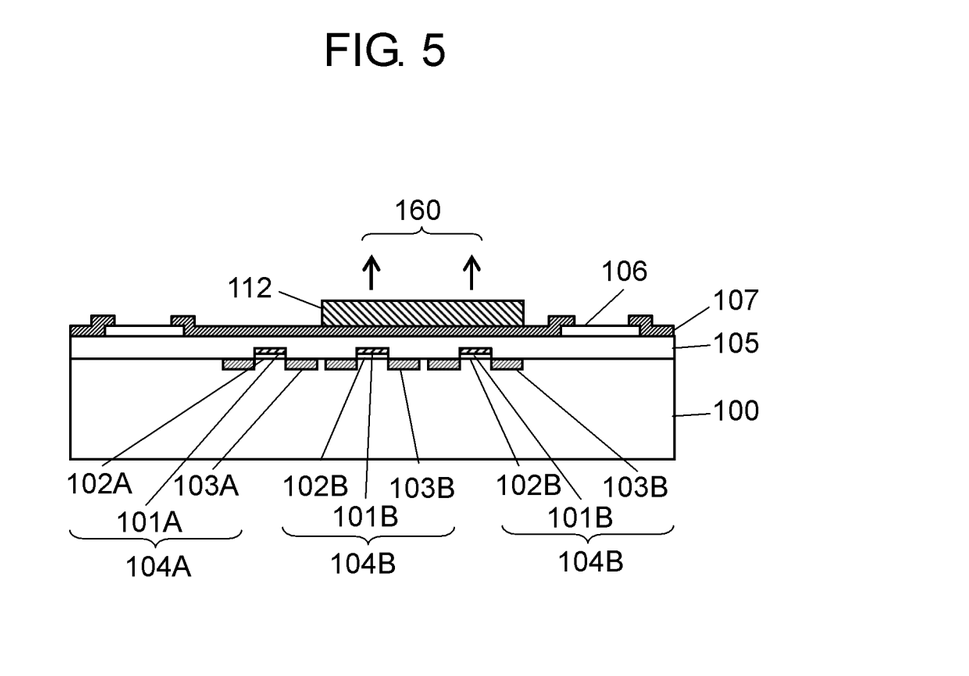
FIG. 5 is a cross-sectional view showing a structure of a semiconductor device according to a third exemplary embodiment.

FIG. 5 is a cross-sectional view showing the structure of the semiconductor device according to the third exemplary embodiment. In FIG. 5, the same components as those of the semiconductor device of the first exemplary embodiment shown in FIGS. 1(a) to (d) are designated by the same reference marks, and a duplicate description is omitted. In addition, in FIG. 5, similar to FIGS. 1(a) to (c), each transistor is illustrated so as to be larger than an actual dimension for easy understanding. That is, the actual numbers of transistors 104A and 104B are larger than the illustrated numbers, respectively, and there are a transistor group (first transistor group) including transistors 104A, and a transistor group (second transistor group) including transistors 104B.

This exemplary embodiment differs from the first exemplary embodiment in that, as shown in FIG. 5, after the steps shown in FIGS. 1(a) and 1(b) of the first exemplary embodiment are sequentially performed, second surface protective film 112 which generates projecting direction stress 160 is formed so as to cover first surface protective film 107 provided in an upper region of "the second transistor group including transistors 104B". As second surface protective film 112, a polyimide film or PBO film may be used. Here, in this exemplary embodiment, it is assumed that transistor 104B is determined as the transistor whose transistor ability is desired to be varied, based on the other transistor as a reference, as the result of the electric characteristics measurement shown in FIG. 1(b).

Thus, an ability of each transistor 104B composing "the second transistor group" positioned under second surface protective film 112 is varied by projecting direction stress 160 generated by second surface protective film 112. That is, since the ability of the transistor composing the semiconductor device can be selectively controlled, the semiconductor device which can achieve desired performance can be provided even when a variation of the transistor abilities is generated while the transistors composing the semiconductor device are produced.

More specifically, like this exemplary embodiment, when it is assumed that a crystal orientation of a main surface of semiconductor substrate 100 is (100) and each transistor 104B is a Nch-type transistor in the case where second surface protective film 112 which generates projecting direction stress 160 is used, the ability of each transistor 104B composing "the second transistor group" becomes higher, compared to a case where second surface protective film 112 is not formed. Even when the ability of each transistor 104B composing "the second transistor group" is low, based on the other transistor group as a reference after the measurement of the electric characteristics shown in FIG. 1(b), the ability of each transistor 104B composing "the second transistor group" is enhanced due to a presence of second surface protective film 112 and the variation in abilities can be reduced, so that the semiconductor device which can achieve desired performance can be provided.

In addition, like this exemplary embodiment, when it is assumed that the crystal orientation of the main surface of semiconductor substrate 100 is (100) and each transistor 104B is a Pch-type transistor in the case where second surface protective film 112 which generates projecting direction stress 160 is used, the ability of each transistor 104B composing "the second transistor group" becomes lower, compared to the case where second surface protective film 112 is not formed. Even when the ability of each transistor 104B composing "the second transistor group" is high, based on the other transistor group as a reference after the measurement of the electric characteristics shown in FIG. 1(b), the ability of each transistor 104B composing "the second transistor group" is lowered due to a presence of second surface protective film 112 and the variation in abilities can be reduced, so that the semiconductor device which can achieve desired performance can be provided.

As described above, in this exemplary embodiment, it is necessary to use second surface protective film 112 with attention to the crystal orientation of the main surface of semiconductor substrate 100, and the conductivity type (Nch or Pch) of transistor 104B.

In addition, in this exemplary embodiment, projecting direction stress 160 can be changed by changing a thickness of second surface protective film 112. Thus, an ability variable value of the transistor group whose ability is desired to be varied can be controlled.

Furthermore, in this exemplary embodiment, an insulator film such as a polyimide film or PBO film may be used as second surface protective film 112.

Furthermore, in this exemplary embodiment, second surface protective film 112 is formed so as to cover first surface protective film 107 in the upper region of "the second transistor group including transistors 104B". In other words, "the second transistor group including transistors 104B" is arranged in a lower region of second surface protective film 112. Here, few transistors 104A or another transistor may be arranged in the lower region of second surface protective film 112. In addition, few transistors 104B may be arranged in an outside region of second surface protective film 112.

(Modification of Third Exemplary Embodiment)

Hereinafter, a description will be made of a semiconductor device according to a modification of the third exemplary embodiment, more specifically, a structure of a semiconductor device provided with a semiconductor circuit including a MIS transistor and the like and a method for producing the same, with reference to the drawings.

Figure 6:
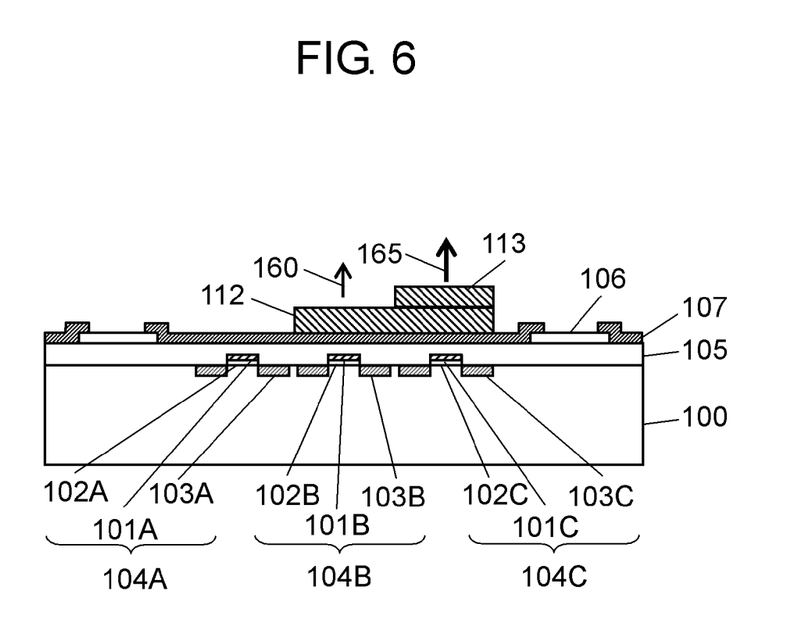
FIG. 6 is a cross-sectional view showing a structure of a semiconductor device according to a modification of the third exemplary embodiment.

FIG. 6 is a cross-sectional view showing the structure of the semiconductor device according to the modification of the third exemplary embodiment. In FIG. 6, the same components as those of the semiconductor device of the first exemplary embodiment shown in FIGS. 1(a) to (d) or the semiconductor device according to the third exemplary embodiment shown in FIG. 5 are designated by the same reference marks, and a duplicate description is omitted. In addition, in FIG. 6, similar to FIGS. 1(a) to (c) and FIG. 5, each transistor is illustrated so as to be larger than an actual dimension for easy understanding. That is, the actual numbers of transistors 104A, 104B, and 104C are larger than the illustrated numbers, respectively, and there are a transistor group (first transistor group) including transistors 104A, a transistor group (second transistor group) including transistors 104B, and a transistor group (third transistor group) including transistors 104C.

This modification differs from the third exemplary embodiment in that, as shown in FIG. 6, "the third transistor group including transistors 104C" covered with first surface protective film 107 and second surface protective film 112 is formed on semiconductor substrate 100, and third surface protective film 113 which generates projecting direction stress 165 is formed so as to cover second surface protective film 112 in an upper region of "the third transistor group including transistors 104C". Here, each transistor 104C has gate electrode 101C formed above semiconductor substrate 100 with gate insulator film 102C interposed therebetween, and source and drain regions 103C formed on both sides of gate electrode 101C, in the semiconductor substrate 100. In addition, it is assumed that transistor 104C is determined as the transistor whose ability is desired to be varied as the result of the electric characteristics measurement shown in FIG. 1(b) of the first exemplary embodiment. Meanwhile, projecting direction stress 165 is provided by adding a projecting direction stress by third surface protective film 113 to projecting direction stress 160 by second surface protective film 112. Furthermore, similar to the third exemplary embodiment, second surface protective film 112 which generates projecting direction stress 160 is formed so as to cover first surface protective film 107 in an upper region of "the second transistor group including transistors 104B" in this modification also.

According to this modification, in addition to the same effect as the third exemplary embodiment, the following effect can be provided. That is, an ability of each transistor 104C composing "the third transistor group" provided under a laminated structure of second surface protective film 112 and third surface protective film 113 which generate projecting direction stress 165 is largely varied by projecting direction stress 165. In other words, the ability of each transistor 104C composing "the third transistor group" is largely varied, compared to a case where third surface protective film 113 is not formed. Therefore, the ability of the transistor composing the semiconductor device can be further selectively controlled.

More specifically, like this modification, when it is assumed that a crystal orientation of a main surface of semiconductor substrate 100 is (100) and each transistor 104C is a Nch-type transistor in the case where third surface protective film 113 which generates projecting direction stress 165 is used, the ability of each transistor 104C composing "the third transistor group" becomes higher, compared to the case where third surface protective film 113 is not formed. Even when the ability of each transistor 104C composing "the third transistor group" is low, based on the other transistor group as a reference after the measurement of the electric characteristics shown in FIG. 1(b), the ability of each transistor 104C composing "the third transistor group" is enhanced due to a presence of third surface protective film 113 and the variation in abilities can be reduced, so that the semiconductor device which can achieve desired performance can be provided.

In addition, like this modification, when it is assumed that the crystal orientation of the main surface of semiconductor substrate 100 is (100) and each transistor 104C is a Pch-type transistor in the case where third surface protective film 113 which generates projecting direction stress 165 is used, the ability of each transistor 104C composing "the third transistor group" becomes lower, compared to the case where third surface protective film 113 is not formed. Even when the ability of each transistor 104C composing "the third transistor group" is high, based on the other transistor group as a reference after the measurement of the electric characteristics shown in FIG. 1(b), the ability of each transistor 104C composing "the third transistor group" is lowered due to a presence of third surface protective film 113 and the variation in abilities can be reduced, so that the semiconductor device which can achieve desired performance can be provided.

Meanwhile, in this modification, projecting direction stress 165 can be changed by changing at least one of a thickness of second surface protective film 112 and a thickness of third surface protective film 113. Thus, an ability variable value of the transistor group whose ability is desired to be varied can be controlled.

In addition, in this modification, an insulator film such as a polyimide film or PBO film may be used as third surface protective film 113.

Furthermore, in this modification, second surface protective film 112 is formed so as to cover first surface protective film 107 provided in the upper region of "the second transistor group including transistors 104B". In other words, "the second transistor group including transistors 104B" is arranged in a lower region of second surface protective film 112. Here, few transistors 104A or another transistor may be arranged in the lower region of second surface protective film 112. In addition, few transistors 104B may be arranged in an outside region of second surface protective film 112.

In addition, in this modification, third surface protective film 113 is formed so as to cover second surface protective film 112 provided in the upper region of "the third transistor group including transistors 104C". In other words, "the third transistor group including transistors 104C" is arranged in a lower region of third surface protective film 113. Here, few transistors 104A and 104B or another transistor may be arranged in the lower region of third surface protective film 113. In addition, few transistors 104C may be arranged in an outside region of third surface protective film 113.

(Fourth Exemplary Embodiment)

Hereinafter, a description will be made of a semiconductor device according to a fourth exemplary embodiment, more specifically, a structure of a semiconductor device provided with a semiconductor circuit including a MIS transistor and the like and a method for producing the same, with reference to the drawings.

Figure 7:
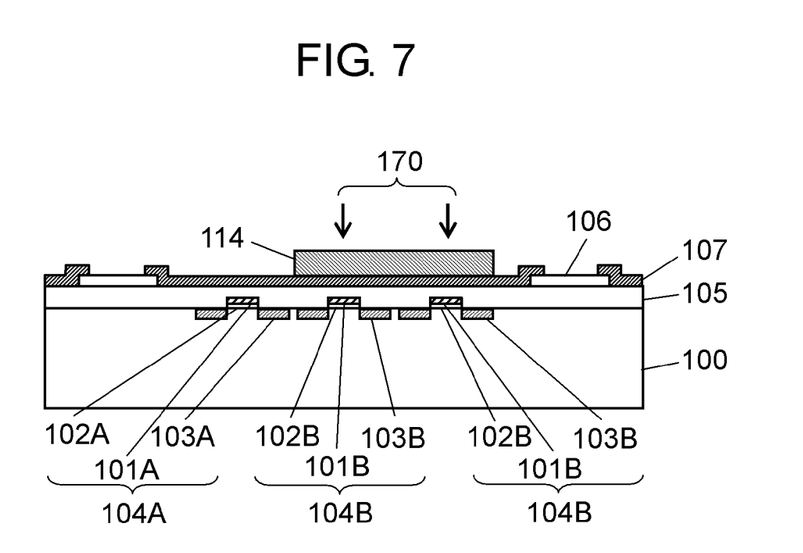
FIG. 7 is a cross-sectional view showing a structure of a semiconductor device according to a fourth exemplary embodiment.

FIG. 7 is a cross-sectional view showing the structure of the semiconductor device according to the fourth exemplary embodiment. In FIG. 7, the same components as those of the semiconductor device of the first exemplary embodiment shown in FIGS. 1(a) to (d) are designated by the same reference marks, and a duplicate description is omitted. In addition, in FIG. 7, similar to FIGS. 1(a) to (c), each transistor is illustrated so as to be larger than an actual dimension for easy understanding. That is, the actual numbers of transistors 104A and 104B are larger than the illustrated numbers, respectively, and there are a transistor group (first transistor group) including transistors 104A, and a transistor group (second transistor group) including transistors 104B.

This exemplary embodiment differs from the first exemplary embodiment in that, as shown in FIG. 7, after the steps shown in FIGS. 1(a) and 1(b) of the first exemplary embodiment are sequentially performed, second surface protective film 114 which generates caving-in direction stress 170 is formed so as to cover first surface protective film 107 provided in an upper region of "the second transistor group including transistors 104B". As second surface protective film 114, a polyimide film or a PBO film may be used. Here, in this exemplary embodiment, it is assumed that transistor 104B is determined as the transistor whose transistor ability is desired to be varied, based on the other transistor as a reference, as the result of the electric characteristics measurement shown in FIG. 1(*b*).

Thus, an ability of each transistor 104B composing "the second transistor group" positioned under second surface protective film 114 is varied by caving-in direction stress 170 generated by second surface protective film 114. That is, since the ability of the transistor composing the semiconductor device can be selectively controlled, the semiconductor device which can achieve desired performance can be provided even when a variation in the transistor abilities is generated while the transistors composing the semiconductor device are produced.

More specifically, like this exemplary embodiment, when it is assumed that a crystal orientation of a main surface of semiconductor substrate 100 is (100) and each transistor 104B is a Nch-type transistor in the case where second surface protective film 114 which generates caving-in direction stress 170 is used, the ability of each transistor 104B composing "the second transistor group" becomes lower, compared to a case where second surface protective film 114 is not formed. Even when the ability of each transistor 104B composing "the second transistor group" is high, based on the other transistor group as a reference after the measurement of the electric characteristics shown in FIG. 1(*b*), the ability of each transistor 104B composing "the second transistor group" is lowered due to a presence of second surface protective film 114 and the variation in abilities can be reduced, so that the semiconductor device which can achieve desired performance can be provided.

In addition, like this exemplary embodiment, when it is assumed that the crystal orientation of the main surface of semiconductor substrate 100 is (100) and each transistor 104B is a Pch-type transistor in the case where second surface protective film 114 which generates caving-in direction stress 170 is used, the ability of each transistor 104B composing "the second transistor group" becomes higher, compared to the case where second surface protective film 114 is not formed. Even when the ability of each transistor 104B composing "the second transistor group" is low, based on the other transistor group as a reference after the measurement of the electric characteristics shown in FIG. 1(*b*), the ability of each transistor 104B composing "the second transistor group" is enhanced due to a presence of second surface protective film 114 and the variation in abilities can be reduced, so that the semiconductor device which can achieve desired performance can be provided.

As described above, in this exemplary embodiment, it is necessary to use second surface protective film 114 with attention to the crystal orientation of the main surface of semiconductor substrate 100, and the conductivity type (Nch or Pch) of transistor 104B.

In addition, in this exemplary embodiment, caving-in direction stress 170 can be changed by changing a thickness of second surface protective film 114. Thus, an ability variable value of the transistor group whose ability is desired to be varied can be controlled.

Meanwhile, in this exemplary embodiment, an insulator film such as a polyimide film or PBO film may be used as second surface protective film 114.

Furthermore, in this exemplary embodiment, second surface protective film 114 is formed so as to cover first surface protective film 107 provided in the upper region of "the second transistor group including transistors 104B". In other words, "the second transistor group including transistors 104B" is arranged in a lower region of second surface protective film 114. Here, few transistors 104A or another transistor may be arranged in the lower region of second surface protective film 114. In addition, few transistors 104B may be arranged in an outside region of second surface protective film 114.

(Modification of Fourth Exemplary Embodiment)

Hereinafter, a description will be made of a semiconductor device according to a modification of the fourth exemplary embodiment, more specifically, a structure of a semiconductor device provided with a semiconductor circuit including a MIS transistor and the like and a method for producing the same, with reference to the drawings.

Figure 8:
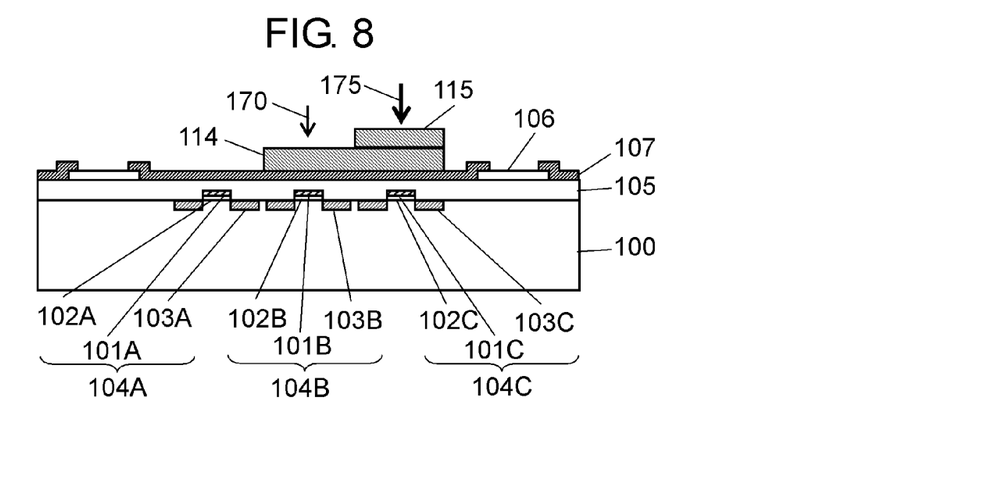
FIG. 8 is a cross-sectional view showing a structure of a semiconductor device according to a modification of the fourth exemplary embodiment.

FIG. 8 is a cross-sectional view showing the structure of the semiconductor device according to the modification of the fourth exemplary embodiment. In FIG. 8, the same components as those of the semiconductor device of the first exemplary embodiment shown in FIGS. 1(*a*) to (*d*) or the semiconductor device according to the fourth exemplary embodiment shown in FIG. 7 are designated by the same reference marks, and a duplicate description is omitted. In addition, in FIG. 8, similar to FIGS. 1(*a*) to (*c*) and FIG. 7, each transistor is illustrated so as to be larger than an actual dimension for easy understanding. That is, the actual numbers of transistors 104A, 104B, and 104C are larger than the illustrated numbers, respectively, and there are a transistor group (first transistor group) including transistors 104A, a transistor group (second transistor group) including transistors 104B, and a transistor group (third transistor group) including transistors 104C.

This modification differs from the fourth exemplary embodiment in that, as shown in FIG. 8, "the third transistor group including transistors 104C" covered with first surface protective film 107 and second surface protective film 114 is formed on semiconductor substrate 100, and third surface protective film 115 which generates caving-in direction stress 175 is formed so as to cover second surface protective film 114 in an upper region of "the third transistor group including transistors 104C". Here, each transistor 104C has gate electrode 101C formed above semiconductor substrate 100 with gate insulator film 102C interposed therebetween, and source and drain regions 103C formed on both sides of gate electrode 101C, in semiconductor substrate 100. In addition, it is assumed that transistor 104C is determined as the transistor whose ability is desired to be varied, as the result of the electric characteristics measurement shown in FIG. 1(*b*) of the first exemplary embodiment. Meanwhile, caving-in direction stress 175 is provided by adding a caving-in direction stress by third surface protective film 115 to caving-in direction stress 170 by second surface protective film 114. Furthermore, similar to the fourth exemplary embodiment, second surface protective film 114 which generates caving-in direction stress 170 is formed so as to cover first surface protective film 107 in an upper region of "the second transistor group including transistors 104B" in this modification also.

According to this modification, in addition to the same effect as the fourth exemplary embodiment, the following effect can be provided. That is, an ability of each transistor 104C composing "the third transistor group" positioned under a laminated structure of second surface protective film 114 and third surface protective film 115 which generate caving-in direction stress 175 is largely varied by caving-in direction stress 175. In other words, the ability of each transistor 104C composing "the third transistor group" is largely varied, compared to a case where third surface protective film 115 is not formed. Therefore, the ability of the transistor composing the semiconductor device can be further selectively controlled.

More specifically, like this modification, when it is assumed that a crystal orientation of a main surface of semiconductor substrate 100 is (100) and each transistor 104C is a Nch-type transistor in the case where third surface protective film 115 which generates caving-in direction stress 175 is used, the ability of each transistor 104C composing "the third transistor group" becomes lower, compared to the case where third surface protective film 115 is not formed. Even when the ability of each transistor 104C composing "the third transistor group" is high, based on the other transistor group as a reference after the measurement of the electric characteristics shown in FIG. 1(b), the ability of each transistor 104C composing "the third transistor group" is lowered due to a presence of third surface protective film 115 and the variation in abilities can be reduced, so that the semiconductor device which can achieve desired performance can be provided.

In addition, like this modification, when it is assumed that the crystal orientation of the main surface of semiconductor substrate 100 is (100) and each transistor 104C is a Pch-type transistor in the case where third surface protective film 115 which generates caving-in direction stress 175 is used, the ability of each transistor 104C composing "the third transistor group" becomes higher, compared to the case where third surface protective film 115 is not formed. Even when the ability of each transistor 104C composing "the third transistor group" is low, based on the other transistor group as a reference after the measurement of the electric characteristics shown in FIG. 1(b), the ability of each transistor 104C composing "the third transistor group" is enhanced due to a presence of third surface protective film 115 and the variation in abilities can be reduced, so that the semiconductor device which can achieve desired performance can be provided.

Meanwhile, in this modification, caving-in direction stress 175 can be changed by changing at least one of a thickness of second surface protective film 114 and a thickness of third surface protective film 115. Thus, an ability variable value of the transistor group whose ability is desired to be varied can be controlled.

In addition, in this modification, an insulator film such as a polyimide film or PBO film may be used as third surface protective film 115.

Furthermore, in this modification, second surface protective film 114 is formed so as to cover first surface protective film 107 in the upper region of "the second transistor group including transistors 104B". In other words, "the second transistor group including transistors 104B" is arranged in a lower region of second surface protective film 114. Here, few transistors 104A or another transistor may be arranged in the lower region of second surface protective film 114. In addition, few transistors 104B may be arranged in an outside region of second surface protective film 114.

In addition, in this modification, third surface protective film 115 is formed so as to cover second surface protective film 114 in the upper region of "the third transistor group including transistors 104C". In other words, "the third transistor group including transistors 104C" is arranged in a lower region of third surface protective film 115. Here, few transistors 104A and 104B or another transistor may be arranged in the lower region of third surface protective film 115. In addition, few transistors 104C may be arranged in an outside region of third surface protective film 115.

As described above, according to the present invention, a first semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a projecting direction. A transistor ability of the first transistor group is varied to be relatively higher due to a presence of the second protective film, based on a transistor ability of the second transistor group, as a reference.

In addition, a second semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a projecting direction. A transistor ability of the first transistor group is varied to be relatively lower due to a presence of the second protective film, based on a transistor ability of the second transistor group, as a reference.

As for the first or second semiconductor device according to the present invention, a variation of the transistor ability of the first transistor group may be controlled by adjusting a thickness of the second protective film.

The first or second semiconductor device according to the present invention may further include a third transistor group formed on the semiconductor substrate and covered with the first protective film and the second protective film, and a third protective film which is formed so as to cover the second protective film provided in an upper region of the third transistor group, and capable of generating a stress in a projecting direction In this case, a transistor ability of the third transistor group is more varied due to a presence of the third protective film than a case where the third protective film is not formed. In this case, a variation of the transistor ability of the third transistor group may be controlled by adjusting a thickness of the third protective film.

A third semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a caving-in direction. A transistor ability of the first transistor group is varied to be relatively higher due to a presence of the second protective film, based on a transistor ability of the second transistor group, as a reference.

A fourth semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film except for an upper region of the first transistor group, and capable of generating a stress in a caving-in direction. A transistor ability of the first transistor group is varied to be relatively lower due to a presence of the second protective film, based on a transistor ability of the second transistor group, as a reference.

As for the third or fourth semiconductor device according to the present invention, a variation of the transistor ability of the first transistor group may be controlled by adjusting a thickness of the second protective film.

The third or fourth semiconductor device according to the present invention may further include a third transistor group formed on the semiconductor substrate and covered with the first protective film and the second protective film, and a third protective film formed so as to cover the second protective film provided in an upper region of the third transistor group, and capable of generating a stress in a caving-in direction. In this case, a transistor ability of the third transistor group is more varied by the third protective film than a case where the third protective film is not formed. In this case, a variation of the transistor ability of the third transistor group may be controlled by adjusting a thickness of the third protective film.

A fifth semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a projecting direction. A transistor ability of the second transistor group is varied to be higher due to a presence of the second protective film than a case where the second protective film is not formed.

In addition, a sixth semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a projecting direction. A transistor ability of the second transistor group is varied to be lower due to a presence of the second protective film than a case where the second protective film is not formed.

As for the fifth or sixth semiconductor device according to the present invention, a variation of the transistor ability of the second transistor group may be controlled by adjusting a thickness of the second protective film.

The fifth or sixth semiconductor device according to the present invention may further include a third transistor group formed on the semiconductor substrate and covered with the first protective film and the second protective film, and a third protective film which is formed so as to cover the second protective film provided in an upper region of the third transistor group, and capable of generating a stress in a projecting direction. In this case, a transistor ability of the third transistor group is more varied due to a presence of the third protective film than a case where the third protective film is not formed. In this case, a variation of the transistor ability of the third transistor group may be controlled by adjusting a thickness of the third protective film.

A seventh semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a caving-in direction. A transistor ability of the second transistor group is varied to be higher due to a presence of the second protective film than a case where the second protective film is not formed.

In addition, an eighth semiconductor device includes a first transistor group and a second transistor group both formed on a semiconductor substrate, an electrode pad which is formed above the semiconductor substrate, and electrically connects with an external contact, a first protective film formed so as to cover the semiconductor substrate except for an upper region of the electrode pad, and a second protective film which is formed so as to cover the first protective film provided in an upper region of the second transistor group, and capable of generating a stress in a caving-in direction. A transistor ability of the second transistor group is varied to be lower due to a presence of the second protective film than a case where the second protective film is not formed.

As for the seventh or eighth semiconductor device according to the present invention, a variation of the transistor ability of the second transistor group may be controlled by adjusting a thickness of the second protective film.

The seventh or eighth semiconductor device according to the present invention may further include a third transistor group formed on the semiconductor substrate and covered with the first protective film and the second protective film, and a third protective film which is formed so as to cover the second protective film provided in an upper region of the third transistor group, and capable of generating a stress in a caving-in direction. In this case, a transistor ability of the third transistor group is more varied by the third protective film than a case where the third protective film is not formed. In this case, a variation of the transistor ability of the third transistor group may be controlled by adjusting a thickness of the third protective film.

As for the first to eighth semiconductor devices according to the present invention, the first protective film may be a SiN film. In addition, instead of the SiN film, a polyimide film or PBO film may be used. In addition, as the second protective film, a polyimide film or PBO film may be used.

In addition, as for the first to eighth semiconductor devices according to the present invention, the semiconductor substrate may be a semiconductor wafer.

Furthermore, as for the first to eighth semiconductor devices according to the present invention, the first protective film may cover an end of the electrode pad.

According to the semiconductor devices, since the ability of the transistor composing the semiconductor device can be selectively controlled, the semiconductor device capable of achieving desired performance can be provided even when a variation in transistor abilities is generated while the transistors composing the semiconductor device are produced.

The present invention is useful when applied to a structure of a semiconductor device, especially a structure of a semiconductor device provided with a semiconductor circuit and the like including a MIS transistor.

What is claimed is:
1. A semiconductor device comprising:
a first transistor group and a second transistor group both formed on a semiconductor substrate;
an electrode pad electrically connecting with an external contact, the electrode pad being formed above the semiconductor substrate;

a first protective film formed so as to cover the semiconductor substrate except for an upper region of the electrode pad; and a second protective film capable of generating a stress in a projecting direction, the second protective film being formed so as to cover the first protective film except for an upper region of the first transistor group, wherein a transistor ability of the first transistor group is varied to be relatively higher due to a presence of the second protective film, based on a transistor ability of the second transistor group, as a reference, and the transistor ability is one of an Idsat ability, a Vt ability, or carrier mobility.

2. A semiconductor device comprising:

a first transistor group and a second transistor group both formed on a semiconductor substrate;

an electrode pad electrically connecting with an external contact, the electrode pad being formed above the semiconductor substrate;

a first protective film formed so as to cover the semiconductor substrate except for an upper region of the electrode pad; and a second protective film capable of generating a stress in a projecting direction, the second protective film being formed so as to cover the first protective film except for an upper region of the first transistor group, wherein a transistor ability of the first transistor group is varied relatively lower due to a presence of the second protective film, based on a transistor ability of the second transistor group, as a reference, and the transistor ability is one of an Idsat ability, a Vt ability, or carrier mobility.

3. The semiconductor device according to claim 1, wherein a variation of the transistor ability of the first transistor group is controlled by adjusting a thickness of the second protective film.

4. The semiconductor device according to claim 3, further comprising:

a third transistor group formed on the semiconductor substrate and covered with the first protective film and the second protective film; and a third protective film capable of generating a stress in a projecting direction, the third protective film being formed so as to cover the second protective film provided in an upper region of the third transistor group, wherein a transistor ability of the third transistor group is more varied due to a presence of the third protective film than a case where the third protective film is not formed.

5. The semiconductor device according to claim 4, wherein a variation of the transistor ability of the third transistor group is controlled by adjusting a thickness of the third protective film.

6. A semiconductor device comprising:

a first transistor group and a second transistor group both formed on a semiconductor substrate;

an electrode pad electrically connecting with an external contact, the electrode pad being formed above the semiconductor substrate;

a first protective film formed so as to cover the semiconductor substrate except for an upper region of the electrode pad; and a second protective film capable of generating a stress in a caving-in direction, the second protective film being formed so as to cover the first protective film except for an upper region of the first transistor group, wherein a transistor ability of the first transistor group is varied to be relatively higher due to a presence of the second protective film, based on a transistor ability of the second transistor group, as a reference, and the transistor ability is one of an Idsat ability a Vt ability or carrier mobility.

7. A semiconductor device comprising:

a first transistor group and a second transistor group both formed on a semiconductor substrate;

an electrode pad electrically connecting with an external contact, the electrode pad being formed above the semiconductor substrate;

a first protective film formed so as to cover the semiconductor substrate except for an upper region of the electrode pad; and a second protective film capable of generating a stress in a caving-in direction, the second protective film being formed so as to cover the first protective film except for an upper region of the first transistor group, wherein a transistor ability of the first transistor group is varied to be relatively lower due to a presence of the second protective film, based on a transistor ability of the second transistor group, as a reference, and the transistor ability is one of an Idsat ability, a Vt ability, or carrier mobility.

8. The semiconductor device according to claim 6, wherein a variation of the transistor ability of the first transistor group is controlled by adjusting a thickness of the second protective film.

9. The semiconductor device according to claim 8, further comprising:

a third transistor group formed on the semiconductor substrate and covered with the first protective film and the second protective film; and a third protective film capable of generating a stress in a caving-in direction, the third protective film being formed so as to cover the second protective film provided in an upper region of the third transistor group, wherein a transistor ability of the third transistor group is more varied due to a presence of the third protective film than a case where the third protective film is not formed.

10. The semiconductor device according to claim 9, wherein a variation of the transistor ability of the third transistor group is controlled by adjusting a thickness of the third protective film.

11. A semiconductor device comprising:

a first transistor group and a second transistor group both formed on a semiconductor substrate;

an electrode pad electrically connecting with an external contact, the electrode pad being formed above the semiconductor substrate;

a first protective film formed so as to cover the semiconductor substrate except for an upper region of the electrode pad; and a second protective film capable of generating a stress in a projecting direction, the second protective film being formed so as to cover the first protective film provided in an upper region of the second transistor group, wherein a transistor ability of the second transistor group is varied to be higher due to a presence of the second protective film than a case where the second protective film is not formed, and the transistor ability is one of an Idsat ability, a Vt ability, or carrier mobility.

12. A semiconductor device comprising:
a first transistor group and a second transistor group both formed on a semiconductor substrate;
an electrode pad electrically connecting with an external contact, the electrode pad being formed above the semiconductor substrate;
a first protective film formed so as to cover the semiconductor substrate except for an upper region of the electrode pad; and
a second protective film capable of generating a stress in a projecting direction, the second protective film being formed so as to cover the first protective film provided in an upper region of the second transistor group, wherein
a transistor ability of the second transistor group is varied to be lower due to a presence of the second protective film than a case where the second protective film is not formed, and
the transistor ability is one of an Idsat ability, a Vt ability, or carrier mobility.

13. The semiconductor device according to claim 11, wherein a variation of the transistor ability of the second transistor group is controlled by adjusting a thickness of the second protective film.

14. The semiconductor device according to claim 13, further comprising:
a third transistor group formed on the semiconductor substrate and covered with the first protective film and the second protective film; and
a third protective film capable of generating a stress in a projecting direction, the third protective film being formed so as to cover the second protective film provided in an upper region of the third transistor group, wherein
a transistor ability of the third transistor group is more varied due to a presence of the third protective film than a case where the third protective film is not formed.

15. The semiconductor device according to claim 14, wherein a variation of the transistor ability of the third transistor group is controlled by adjusting a thickness of the third protective film.

16. A semiconductor device comprising:
a first transistor group and a second transistor group both formed on a semiconductor substrate;
an electrode pad electrically connecting with an external contact, the electrode pad being formed above the semiconductor substrate;
a first protective film formed so as to cover the semiconductor substrate except for an upper region of the electrode pad; and
a second protective film capable of generating a stress in a caving-in direction, the second protective film being formed so as to cover the first protective film provided in an upper region of the second transistor group, wherein
a transistor ability of the second transistor group is varied to be higher due to a presence of the second protective film than a case where the second protective film is not formed, and
the transistor ability is one of an Idsat ability, a Vt ability, or carrier mobility.

17. A semiconductor device comprising:
a first transistor group and a second transistor group both formed on a semiconductor substrate;
an electrode pad electrically connecting with an external contact, the electrode pad being formed above the semiconductor substrate;
a first protective film formed so as to cover the semiconductor substrate except for an upper region of the electrode pad; and
a second protective film capable of generating a stress in a caving-in direction, the second protective film being formed so as to cover the first protective film provided in an upper region of the second transistor group, wherein
a transistor ability of the second transistor group is varied to be lower due to a presence of the second protective film than a case where the second protective film is not formed, and
the transistor ability is one of an Idsat ability, a Vt ability, or carrier mobility.

18. The semiconductor device according to claim 16, wherein a variation of the transistor ability of the second transistor group is controlled by adjusting a thickness of the second protective film.

19. The semiconductor device according to claim 18, further comprising:
a third transistor group formed on the semiconductor substrate and covered with the first protective film and the second protective film; and
a third protective film capable of generating a stress in a caving-in direction, the third protective film being formed so as to cover the second protective film provided in an upper region of the third transistor group, wherein
a transistor ability of the third transistor group is more varied due to a presence of the third protective film than a case where the third protective film is not formed.

20. The semiconductor device according to claim 19, wherein a variation of the transistor ability of the third transistor group is controlled by adjusting a thickness of the third protective film.

21. The semiconductor device according to claim 5, wherein the first protective film is a SiN film.

* * * * *